(12) United States Patent
Barth, Jr.

(10) Patent No.: US 6,738,300 B2
(45) Date of Patent: May 18, 2004

(54) DIRECT READ OF DRAM CELL USING HIGH TRANSFER RATIO

(75) Inventor: John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/228,142

(22) Filed: Aug. 26, 2002

(65) Prior Publication Data

US 2004/0037138 A1 Feb. 26, 2004

(51) Int. Cl.$^7$ ................................................ G11C 7/00
(52) U.S. Cl. ................................. 365/203; 365/189.04
(58) Field of Search ................................ 365/203, 196, 365/205, 189.04, 207, 104

(56) References Cited

U.S. PATENT DOCUMENTS

| | | | |
|---|---|---|---|
| 5,010,524 A | 4/1991 | Fifield et al. | |
| 5,339,274 A | 8/1994 | Dhong et al. | |
| 5,568,434 A | 10/1996 | Jeon | |
| 5,574,696 A | 11/1996 | Murotani | |
| 5,666,315 A | 9/1997 | Tsukude et al. | |
| 5,734,613 A | * 3/1998 | Gibson | 365/189.04 |
| 5,754,488 A | 5/1998 | Suh | |
| 5,790,467 A | 8/1998 | Haukness et al. | |
| 5,831,919 A | 11/1998 | Haukness et al. | |
| 5,936,432 A | 8/1999 | Oh et al. | |
| 5,943,253 A | 8/1999 | Matsumiya et al. | |
| 6,031,775 A | * 2/2000 | Chang et al. | 365/205 |
| 6,072,749 A | 6/2000 | Nakamura et al. | |
| 6,088,291 A | 7/2000 | Fujioka et al. | |
| 6,147,919 A | 11/2000 | Kawabata et al. | |
| 6,181,620 B1 | 1/2001 | Agata et al. | |
| 6,185,123 B1 | 2/2001 | Allen et al. | |
| 6,188,625 B1 | 2/2001 | Kawabata et al. | |
| 6,208,575 B1 | 3/2001 | Proebsting | |
| 6,288,969 B1 | * 9/2001 | Gibbins et al. | 365/230.05 |

FOREIGN PATENT DOCUMENTS

| | | |
|---|---|---|
| JP | 62217490 A | 2/1989 |
| JP | 5002870 | 1/1993 |
| JP | 11086549 A | 3/1999 |
| JP | 2000011655 A | 1/2000 |

* cited by examiner

*Primary Examiner*—Thong Q. Le
(74) *Attorney, Agent, or Firm*—Todd M. C. Li; Scully, Scott, Murphy & Presser (57) ABSTRACT

A sensing circuit for performing a direct read of a DRAM memory cell by using a high transfer ratio and a single ended read of a single bitline, wherein a limited number of memory cells are connected to the single bitline to limit the capacitance thereof to provide the high transfer ration. The direct read circuit includes four transistor devices, with three devices preferentially being nFETs. The direct read circuit provides a self-timed write back of data to a memory cell after the data is destructively read from the memory cell in a read operation, provides significant electrical power savings relative to prior art read circuits, as a read operation of a data 0 does not utilize any significant electrical power, and in a folded bitline architecture provides improved noise immunity as each non-active bitline shields an adjacent active bitline.

20 Claims, 6 Drawing Sheets

DIRECT READ OF DRAM CELL USING HIGH TRANSFER RATIO

BACKGROUND OF THE INVENTION

1. Field of the Invention

The present invention relates generally to sensing circuits for performing a direct read of a DRAM cell using a high transfer ratio ($C_{cell}/(C_{b1}+C_{cell})$), and more particularly pertains to sensing circuits for performing a direct read of a DRAM cell using a high transfer ratio and a single ended read of a single bitline.

2. Discussion of the Prior Art

Conventional DRAMs use sensing schemes that require amplifiers capable of sensing small sense signals. The most effective way to amplify small sense signals has been shown to be a cross-couple sense amplifier, as is well known in the art. These cross-couple sense amplifiers require balanced true and complement bitlines to perform and operate reliably.

Conventional DRAM sensing schemes use destructive read operations, and frequently have a pair of local bitlines BL0, BL1 connected through a gate to a pair of global bitlines GL0, GL1, which are differentially connected to a secondary sense amplifier. The secondary sense amplifier is differentially connected to the far ends of the global bitlines GL0, GL1, and is generally a gain device. In contrast thereto, the direct read DRAM circuits of the present invention do not use differentially connected local bitlines BL0, BL1 and global bitlines GL0, GL1, but instead use a single ended read of a single bitline BL0, GL0, with four transistor devices.

In conventional DRAMs, the sense signal from a memory cell is generated by charge sharing the charge stored in the memory cell with a precharged bitline, and then comparing the developed sense signal on the precharged bitline to a reference bitline.

To achieve maximum density, a large number of memory cells are typically connected to a single bitline to reduce the area overhead of the amplifier. However, adding cells to a bitline also increases the bitline capacitance, and consequently reduces the transfer ratio ($C_{cell}/(C_{b1}+C_{cell})$), which in turn reduces the developed sense signal. Typically the number of bits (memory cells) per bitline is chosen to minimize the number of sense amps (overhead) while maintaining enough sense signal to reliably detect the stored state of a memory cell.

The amplitude of the sense signal $\Delta Vb1$ from a memory cell is a function of the cell capacitance, the bitline capacitance and the voltage swing to the bitline high precharge, as set forth in the following formulas which includes the transfer ratio.

$$\Delta Vb1 = (V_{cell} - V_{b1h}) * (C_{cell}/(C_{b1}+C_{cell})), \text{ and}$$

where $V_{cell}$=voltage stored in the memory cell
$V_{b1h}$=bitline precharge level voltage (typically 1.2–1.8V)
$C_{b1}$=cell capacitance
$C_{b1}$=bitline capacitance

SUMMARY OF THE INVENTION

Accordingly, it is a primary object of the present invention to provide a direct read of a DRAM cell using a high transfer ratio and a single ended read of a single bitline.

A further object of the subject invention is the provision of direct read DRAM circuits which use a single ended read of a single bitline with four devices (N2, N3, N4, P0 in FIG. 1), with three devices preferentially being nFETs.

In accordance with the teachings herein, the transfer ratio of a memory cell ($C_{cell}/(C_{b1}+C_{cell})$) is increased from a typical prior art value of 0.2 to be substantially close or equal to 0.5, which equates to roughly 64 bits (memory cells)/bitline, compared to typically 256 bits/bitline for cross-couple sensing as in the prior art. With a transfer ratio of 0.5, a stored high level of 800 mV and a bitline precharge of GND, the voltage level generated on the bitline would be approximately 400 mV, enough to turn on a standard logic NFET device with a threshold voltage of 250 mV which provides sufficient gain to drive a heavy global bitline.

A sensing circuit for performing a direct read of a DRAM memory cell by using a high transfer ratio and a single ended read of a single bitline, wherein a limited number of memory cells are connected to the single bitline to limit the capacitance thereof to provide the high transfer ratio. The direct read circuit includes four transistor devices, with three devices preferentially being nFETs. The direct read circuit provides a self-timed write back of data to a memory cell after the data is destructively read from the memory cell in a read operation, provides significant electrical power savings relative to prior art read circuits, as a read operation of a data 0 does not utilize any significant electrical power, and in a folded bitline architecture provides improved noise immunity as each non-active bitline shields an adjacent active bitline.

BRIEF DESCRIPTION OF THE DRAWINGS

The foregoing objects and advantages of the present invention for a direct read of a DRAM cell using a high transfer ratio may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

Pursuant to the present invention, the transfer ratio of a memory cell ($C_{cell/(Cb1}+C_{cell})$) is increased from a typical prior art value of 0.2 to be substantially close or equal to 0.5. In a technology where a typical transfer ratio is 1/5 or 0.2, this equates to roughly 64 bits (memory cells)/bitline, compared to typically 256 bits/bitline for cross-couple sensing as in the prior art. A typical Ccell=25×10$^{-15}$ farads, or 25 fF (femtoFarads). For 256 bits/bitline as in the prior art, a typical Cbl=100 fF, whereas for 64 bits/bitline as in the present invention, a typical Cbl=25 fF.

With a transfer ratio of 0.5, a stored high level of 800 mV (assuming the memory cell was weakly written and leaked down), and a bitline precharge of GND, the voltage level generated on the bitline would be approximately 400 mV, enough to turn on a standard logic nFET device with a threshold voltage of 250 mV. By providing a sufficient voltage to turn on a FET device, a local cross-couple sense amplifier is not required, and a single FET device (N4 in FIG. 1) provides sufficient gain to drive a heavy global bitline GBL.

Figure 1:
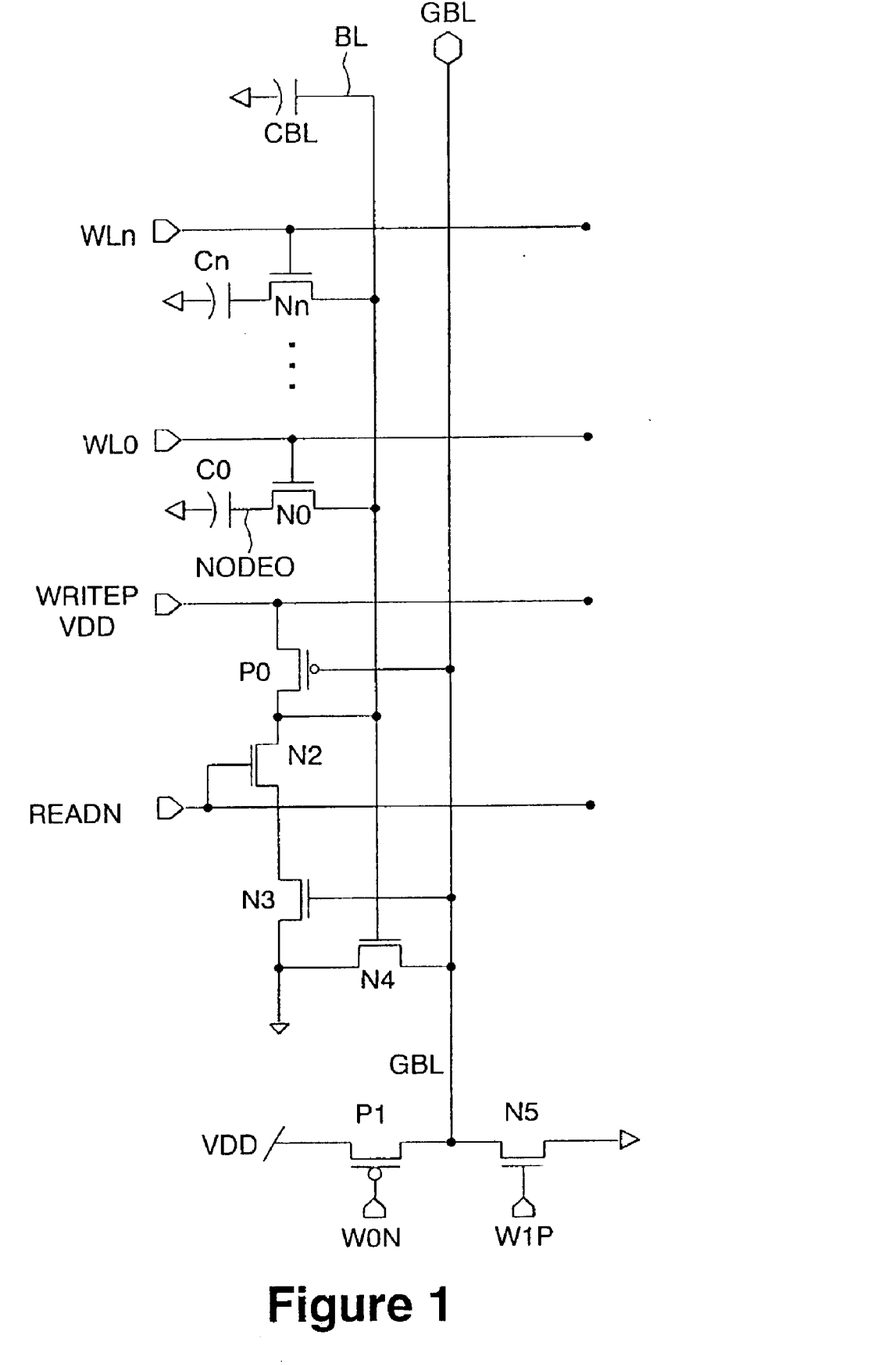
FIG. 1 is a schematic of a single bitline direct read/write circuit pursuant to the present invention.
Figure 2:
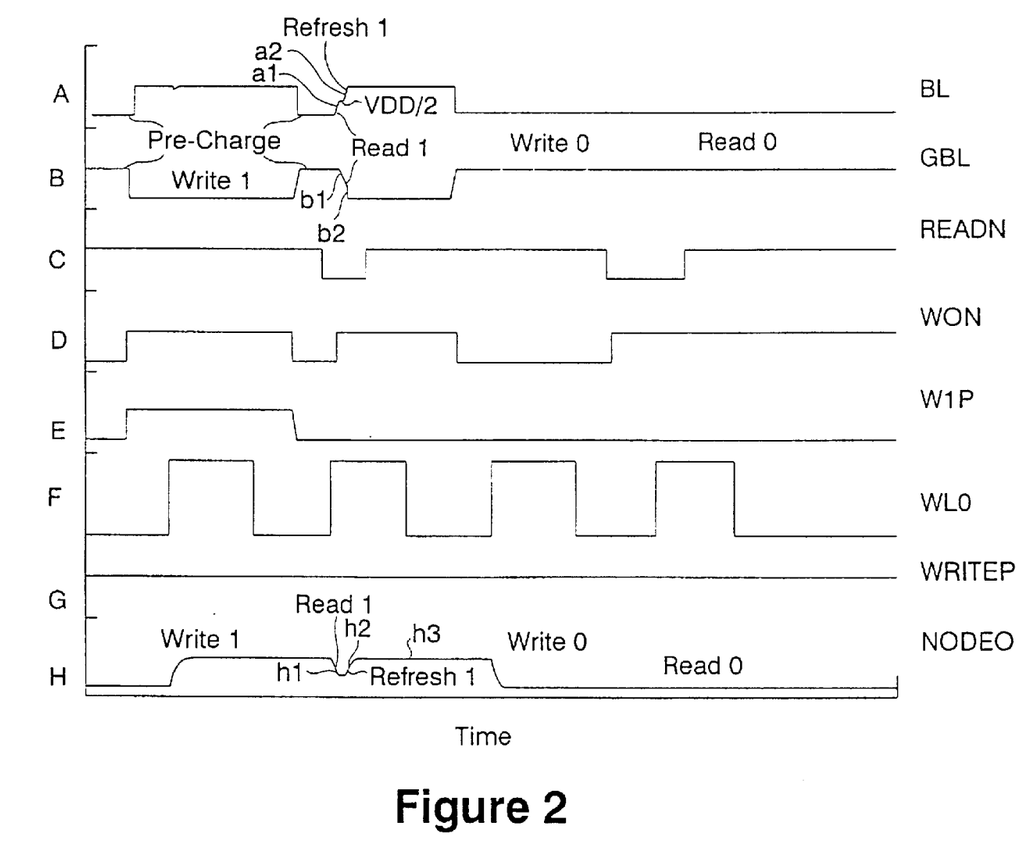
FIG. 2 illustrates simulation waveforms demonstrating a Write 1 operation, Read 1 operation, Write 0 operation, and Read 0 operation.
Figure 2A:
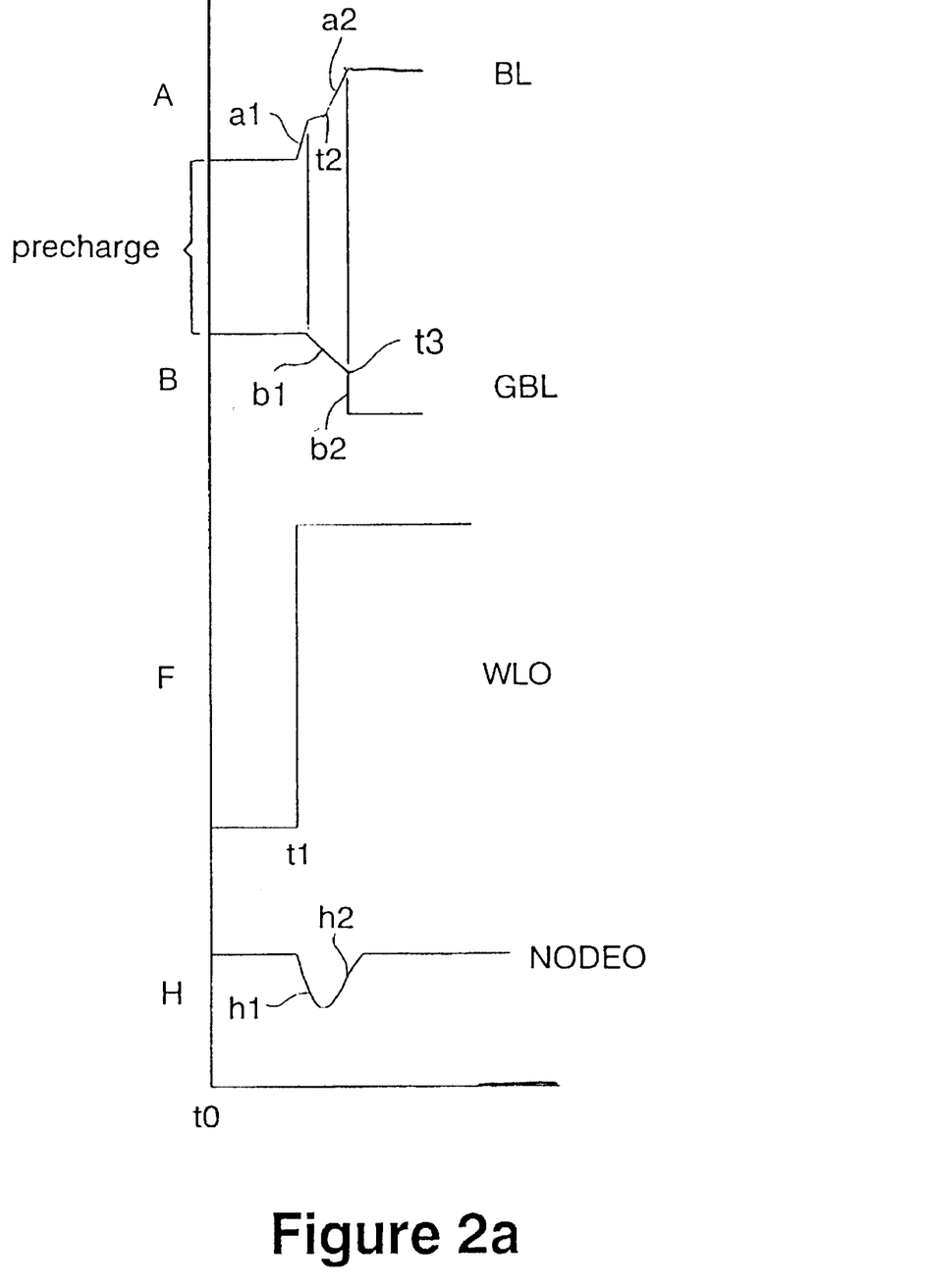
FIG. 2a illustrates enlarged waveforms of the signals shown in FIG. 2-A (which means waveform A shown in FIG. 2, and the same for 2-B, and etc.), 2-B, 2-D, 2-F and 2-H for a read operation of a data 1.

FIG. 1 is a schematic of a single bitline direct read/write circuit pursuant to the present invention, and FIGS. 2 and 2a show waveforms illustrative of operation of the circuit of FIG. 1.

FIG. 1 illustrates a sensing circuit for performing a direct read of a memory cell C0, connected between a NODE0 and ground, using a high transfer ratio and a single ended read of a single bitline BL. The high transfer ratio is achieved by connecting a limited number of memory cells Cn to the single bitline BL to limit the capacitance of the single bitline BL. The array of memory cells is indicated by the three vertical dots and the array of memory cells above the three vertical dots, with only one additional memory cell Cn actually being shown. The memory cell C0 is connected through an access transistor device N0 to the single local bitline BL. A first transistor device P0 has its gate connected to a global bitline GBL, and is connected between a power supply WRITEP (VDD) and the single local bitline BL. A second transistor device N4 has its gate connected to the single local bitline BL, and is connected between the global bitline GBL and ground. A third transistor device N2 has its gate connected to a read signal READN, and is connected between the local bitline BL and a fourth transistor device N3. The fourth transistor device N3 has its gate connected to the global bitline GBL, and is connected between the third transistor device N2 and ground.

In precharge, the global bitline GBL is held at VDD by turning on device P1, as shown by FIG. 2-B, which in turn holds the local bitline BL at GND by turning on devices N3 and N2 (READN signal high), as shown by FIG. 2-A. Prior to a read operation, the local bitline is taken out of precharge by driving the READN signal low, thus floating the local bitline. The word line WL0 going high turns on device N0 connects the selected cell NODE0 to the local bitline BL, reading either a '1' or '0'.

In the case of reading a '0', no charge is transferred and the local bitline BL level remains at ground, as shown by FIG. 2-A, and device N4 remains off (nothing happens).

In the case of reading a '1', the cell and bitline share charge, coupling the local bitline BL up to 400 mV, enough to turn on device N4, as shown in FIG. 2-A-a1, and begin the discharge of the global bitline GBL, as shown in FIG. 2-B-b1. With the WRITEP signal high, and the global bitline GBL discharged to VDD-Pvt (Pvt=the threshold voltage of device P0), the device P0 will turn on and replenish the local bitline BL and the cell node at the positive side of the cell to full VDD, as shown in FIGS. 2-A-a2 and 2-H, and drive the global bitline GBL strongly to GND via device N4, as shown in FIG. 2-B-b2.

A write function is accomplished by driving the global bitline GBL with either the WON signal (write '0' active low) via device P1, or the W1P signal (write '1' active high) via device N5, and enabling the local write circuits with READN signal high and WRITEP signal high.

Bitline precharge to GND is initiated by driving the global bitline GBL high with the WON signal and the READN signal high.

The direct read DRAM circuits of the present invention do not use differentially connected local bitlines BL0, BL1 and global bitlines GL0, GL1, but instead use a single ended read of a single bitline BL, GBL, with four devices, N2, N3, N4, P0 in FIG. 1, with three devices preferentially being nFETs as nFETs provide more drive per unit area than pFETs.

The direct read DRAM cells of the present invention provide several advantageous attributes relative to the conventional DRAM sensing schemes of the prior art.

(1) The direct read DRAM cells of the present invention provide a self-timed write back of data to a memory cell after the data is destructively read from the memory cell in a read operation. For instance during a read operation of a data 1, the charge in the memory cell representative of the data 1 is shared with the local bitline BL and must be written back into the cell at the completion of the read operation. As illustrated by the waveforms of FIG. 2, after a read operation of a data 1, the direct read DRAM cell automatically performs a self-timed write back of a data 1 into the cell without requiring any external timing signals, as are required by some prior art read circuits. A read of a data 0 does not change the charge in the cell and so does not require a write back operation.

(2) The direct read DRAM cells of the present invention provide significant electrical power savings relative to prior art read circuits, as a read operation of a data 0 does not utilize any significant electrical power, whereas prior art read circuits, during a read operation of a data 0, charge a bitline to VDD and then discharge the bitline back to the GND, which are power consuming operations.

Figure 3:
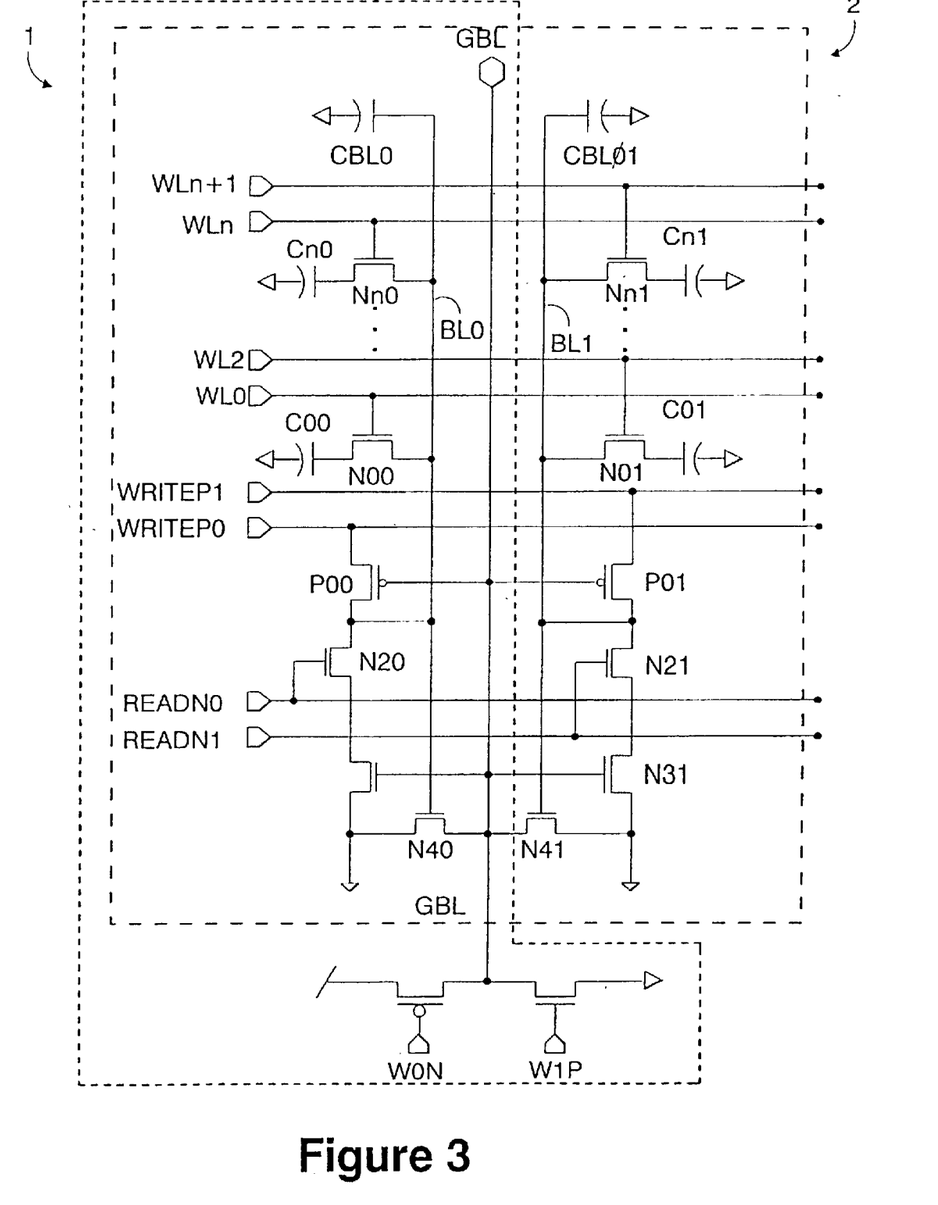
FIG. 3 is a schematic circuit of a second embodiment of the present invention wherein a bitline pair BL0, BL1 are coupled to share a global bitline GBL, in which only one bitline is sensed at a time in a time multiplex mode.

(3) The direct read DRAM cells of the present invention in a folded bitline architecture, as illustrated in FIG. 3, provide improved noise immunity as each non-active bitline shields an adjacent active bitline, such that the shielding provided by the non-active bitline shields adjacent bitlines from the active bitline.

Figure 1A:
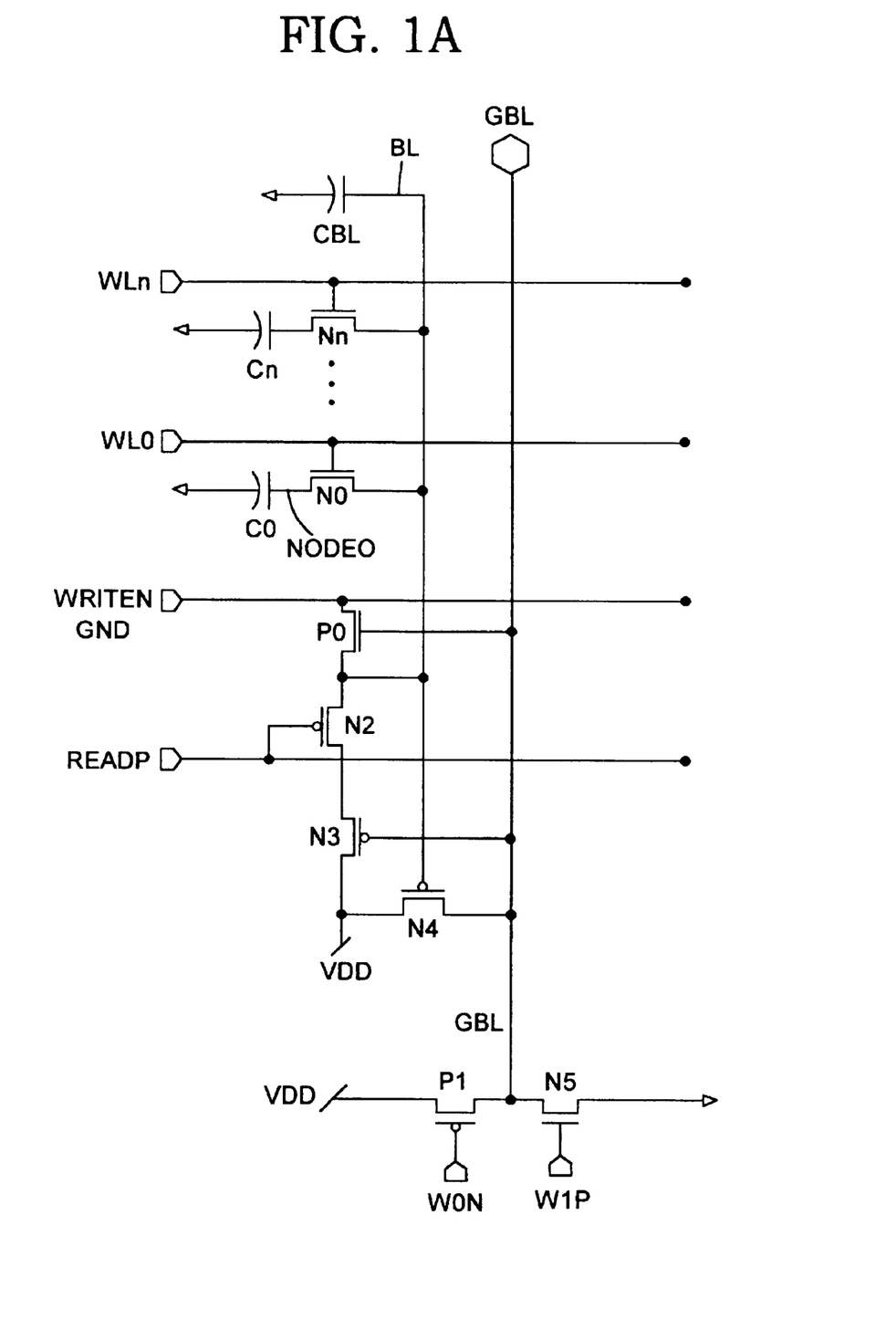
FIG. 1A is a schematic of an alternate embodiment of a single bitline direct read/write circuit pursuant to the present invention.

FIG. 1 illustrates one embodiment of the direct read DRAM cells of the present invention wherein the devices N2, N3 and N4 are nFETs, and the device P0 is a pFET. A complementary polarity embodiment would have the devices N2, N3 and N4 as pFETs and the device P0 as an nFET as illustrated in FIG. 1A. The embodiment of FIG. 1 is advantageous relative to the complementary polarity embodiment as three nFETs require less circuit area than three pFETs, for reasons well known in the art.

A complementary polarity embodiment, as illustrated in FIG. 1A, would operate in a manner analogous to the waveforms illustrated in FIG. 2, as would be understood by one skilled in the art. More specifically, for the complementary embodiment of FIG. 1A, in precharge, the global bitline GBL is held at GND by turning on device N5, which in turn holds the local bitline BL at VDD by turning on devices N3 and N2 (READP sisal low). Prior to a read operation, the local bitline is taken out of precharge by driving the READP signal high, thus floating the local bitline. The word line WL0 going high turns on device N0 connects the selected cell NODE0 to the local bitline BL, reading either a '1' or '0'.

In the case of reading a '1', no charge is transferred and the local bitline BL level remains at VDD, and device N4 remains off (nothing happens).

In the case of reading a '0', the cell and bitline share charge, coupling the local bitline BL down, 400 mV below VDD, enough to turn on device N4, and begin the charging of the global bitline GBL. With the WRITEN signal low, and the global bitline GBL discharged to Nvt (Nvt=the threshold voltage of device P0), the device P0 will turn on and replenish the local bitline BL and the cell node at the positive side of the cell to full GND, and drive the global bitline GBL strongly to VDD via device N4.

A write function is accomplished by driving the global bitline GBL with either the W0N signal (write '0' active low) via device P1, or the W1P signal (write '1' active high) via device N5, and enabling the local write circuits with READP signal low and WRITEN signal low.

Bitline precharge to VDD is initiated by driving the global bitline GBL low with the W1P signal high and the READP signal low.

The waveforms of FIG. 2 illustrate the following functions of the direct read DRAM circuits of the present invention. During the precharge periods, the local bitline BL is FIG. 2 shown simulation waveforms demonstrating a Write 1 operation, Read 1 operation, Write 0 operation corresponding to the embodiment illustrated in FIG. 1 precharged to GND, and the global bitline GBL is precharged to VDD, which is typically 1–1.2V.

Note that during a read operation of a data 1, when the voltage of the local bitline BL0 attains a value of approximately VDD/2, as shown in FIG. 2-A, the threshold voltage of device N4 is reached to turn on the device N4, pulling the global bitline GBL towards ground and when the global bitline GBL reaches a threshold voltage Vth below Vdd, device P0 is turned on, which in turn rapidly pulls the local bitline BL to VDD, as shown by the two sections a1, a2 of the rising voltage at VDD/2 in FIG. 2-A, and also accelerates the discharge of the voltage on the global bitline, as shown by sections b1 and b2 in FIG. 2-B. Note in FIG. 2-H, that during the read of a data 1, the charge in the cell is discharged at h1 as the charge is shared with the local bitline BL, as indicated by the voltage dip in the cell node voltage at FIG. 2-H-h1, and when the device N4 is turned on, the data 1 is automatically written back into the cell at h2, without requiring any external timing signal, as indicated at h3 in FIG. 2-H.

FIG. 2a illustrates enlarged waveforms of the signals shown in FIG. 2-A, 2-B, 2-D, 2-F and 2-H for a read operation of a data 1, with the following signals being illustrated. The signal on the local bitline BL is illustrated in FIG. 2a-A, the signal on the global bitline GBL is illustrated in FIG. 2a-B, the signal on the word line WL0 is illustrated in FIG. 2a-F, and the signal on the memory cell NODE0 is illustrated in FIG. 2a-H. During a precharge period, the local bitline BL is precharged to GND, and the global bitline GBL is precharged to VDD, which is illustrated at time t0. After precharge, the read operation of a data 1 is initiated at time t1 by introducing a high signal on the wordline WL0 which turns on device N0, such that the memory cell shares its charge at NODE0 with the local bitline BL which was initially precharged low. This causes the signal at NODE0 to fall, as shown by the waveform h1, and also causes the bitline BL signal to rise, as shown by the waveform a1. When the voltage of the local bitline BL attains a value of approximately VDD/2 at time t2, as shown in FIG. 2a-A, the threshold voltage of device N4 is reached to turn on the device N4 softly at time t2, which pulls down the global bitline GBL, as shown by the waveform b1. As the signal on GBL falls, device P0 is turned on at time t3, which in turn pulls up the local bitline BL to VDD, which turns device N4 on hard, which accelerates the discharge of the voltage on the global bitline GBL, as shown by the waveform b2, and also accelerates the rise of the signal on the local bitline BL, as shown by the waveform a2, to drive NODE0 high, as shown by the waveform h2.

FIG. 3 is a schematic circuit 1 of a second embodiment of the present invention, wherein circuit 1 corresponds to the circuit of FIG. 1, and wherein a bitline pair BL0, BL1 are coupled to a global bitline GBL, in which only one bitline is sensed at a time, and the unsensed bitline is held at GND precharge. Both bitlines share one global bitline GBL in a time multiplex mode, such that operations of the two bitlines do not interfere with each other.

FIG. 3 illustrates a circuit 1 for a folded bitline architecture having two bitlines BL0 and BL1, each of which is connected to every other cell, and the wordline WL is connected to every other bitline, as is common and well known in a folded bitline architecture. Although the folded bitline architecture has two bitlines BL0 and BL1, the folded bitline embodiment operates in substantially the same manner as the single bitline embodiment of FIG. 1 as only one bitline at a time is ever activated, such that the two bitlines BL0 and BL1 time-share a common global bitline GBL and other common facilities without the time-shared operations ever conflicting with each other.

In this embodiment the nonactive bitline performs a very important function of shielding the active bitline from adjacent bitlines in a matrix of memory cells for improved noise immunity. For instance, if bitline BL0 were activated, nonnative bitline BL1 would shield bitline BL0 from adjacent bitlines to the right in FIG. 3 in a matrix of memory cells.

Figure 4:
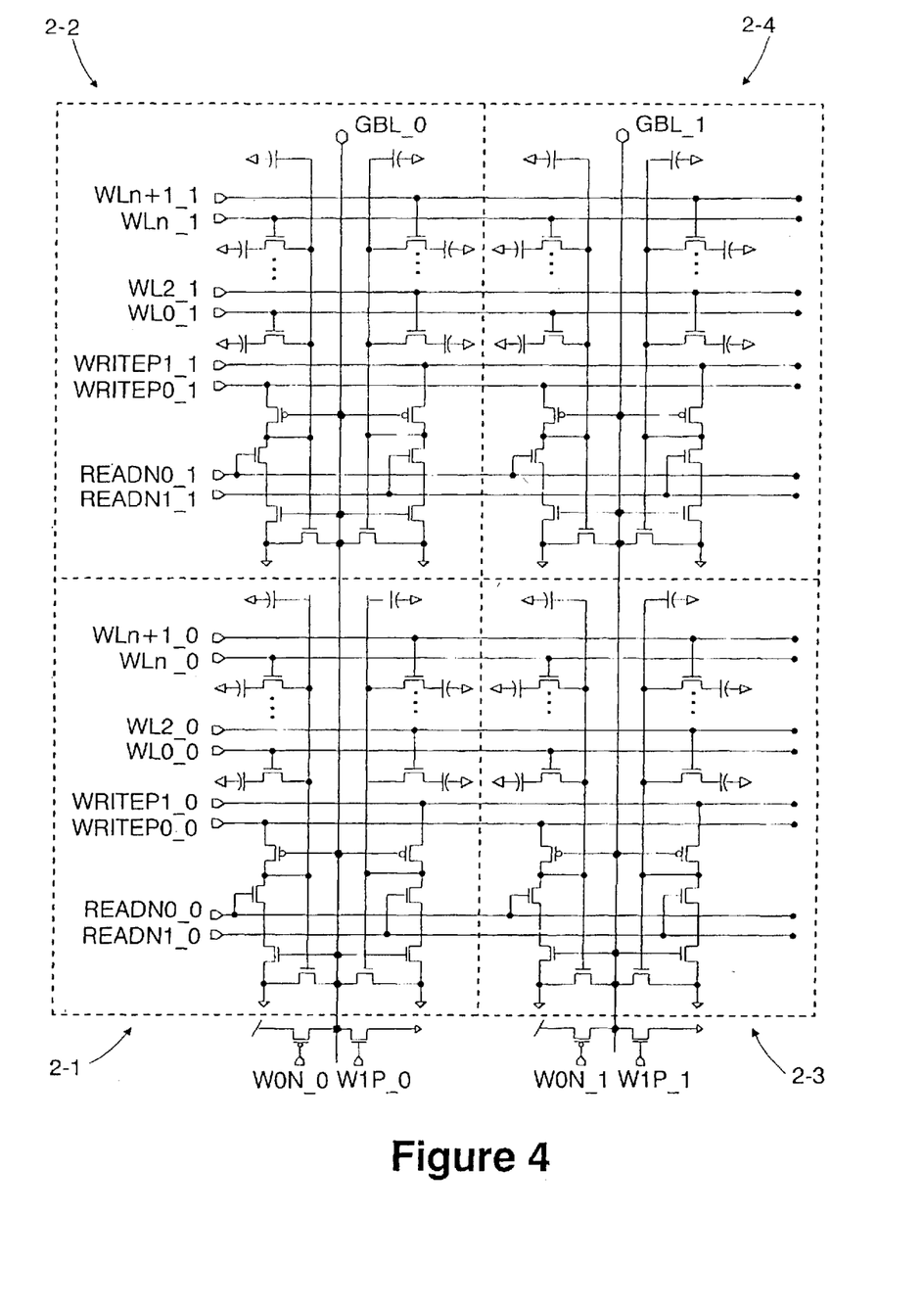
FIG. 4 shows a bitline matrix or array of local bitlines and global bitlines GBL, wherein four circuits as illustrated in FIG. 3 are shown in a 2×2 matrix which is representative of a larger typical n×n matrix.

FIG. 3 also illustrates a circuit block 2 which corresponds to each of the circuits 2-1, 2-2, 2-3 and 2-4 of FIG. 4.

FIG. 4 shows a bitline matrix or array of local bitlines and global bitlines GBL, wherein four circuits 2-1, 2-2, 2-3, 2-4, each corresponding to circuit 2 as illustrated in FIG. 3, are shown in a 2×2 matrix which is representative of a larger typical n×n matrix.

The global bit line write and precharge circuit having inputs W0N_0 and W1P_0 corresponds to the bit line write and precharge circuit of FIG. 2 having transistors P1 and N5 and inputs W0N and W1P, and serves both of the circuits 2-1 and 2-2. Similarly, the global bit line write and precharge circuit having inputs W0N_1 and W1P_1 serves both of the circuits 2-3 and 2-4.

The present invention has been specifically disclosed with respect to a DRAM memory, but also has applicability to other types of memories such as SRAM and ROM memories.

While several embodiments and variations of the present invention for a direct read of DRAM cell using high transfer ratio are described in detail herein, it should be apparent that the disclosure and teachings of the present invention will suggest many alternative designs to those skilled in the art.

I claim:

1. A circuit for performing precharge in a memory system, the circuit comprising:

a memory cell;

a local bitline;

a wordline coupling said memory cell to said local bitline;

a global bitline;

a first transistor having its gate connected to said global bitline, its source terminal connected to a first power supply and its drain terminal connected to said local bitline;

a second transistor having its gate connected to said local bitline, its source terminal connected to a second power supply and its drain terminal connected to said global bitline;

a third transistor having its gate connected to a read signal, its drain terminal connected to said local bitline and its source terminal connected to a fourth transistor at its drain terminal; and said fourth transistor having its gate connected to said global bitline.

2. The circuit of claim 1 wherein:

said first transistor is a p-type transistor;

said second, third and fourth transistors are n-type transistors;

said first power supply is positive VDD and said second power supply is ground.

3. The circuit of claim 1, wherein:

said first transistor is an n-type transistor;

said second, third and fourth transistors are p-type transistors; and said first power supply is ground and said second power supply is VDD.

4. The circuit of claim 1, wherein said memory cell is a DRAM memory cell.

5. The circuit of claim 1, wherein said memory cell is a SRAM memory cell.

6. The circuit of claim 1, wherein said memory cell is a ROM memory cell.

7. The circuit of claim 1, wherein a transfer ratio ($C_{cell}/(C_{b1}+C_{cell})$) of the circuit is substantially close or equal to 0.5.

8. The circuit of claim 7, wherein a limited number of memory cells are connected to the local bitline to limit the capacitance of the local bitline to provide a high transfer ratio.

9. The circuit of claim 1, wherein the first transistor comprises a pFET device, and each of the second, third and fourth transistors comprises an nFET device.

10. The circuit of claim 1, wherein the local bitline is precharged to ground and the global bitline is precharged to VDD.

11. The circuit of claim 10, wherein the global bitline is precharged to VDD by turning on a fifth transistor connected between the global bitline and VDD, and VDD on the global bitline precharges the local bitline to ground by turning on the fourth transistor, with the third transistor being activated by an active read signal.

12. The circuit of claim 6, wherein prior to a read operation, the local bitline is taken out of precharge by turning off the third transistor, thus floating the local bitline.

13. The circuit of claim 1, wherein the memory cell comprises a DRAM memory cell connected in an array of DRAM memory cells.

14. The circuit of claim 1, wherein for a read operation of a data 1, the charge in the memory cell representative of a data 1 is shared with the local bitline, coupling the local bitline to a sufficiently high voltage to turn on the second transistor, which drives the local bitline to VDD and discharges the global bitline, and when the global bitline is discharged to VDD minus the threshold voltage of the first transistor, the first transistor turns on and replenishes the local bitline and the cell node at the positive side of the cell to VDD, and the second transistor drives the global bitline to ground.

15. The circuit of claim 11, wherein for a write function the global bitline is driven with either a write data 0 signal to the gate of the fifth transistor, or by a write data 1 signal to the gate of a sixth transistor connected between the global bitline and ground.

16. The circuit of claim 11, wherein the local bitline is precharged to ground by driving the global bitline high with activating signals to the gates of the third and the fifth transistors.

17. The circuit of claim 1, wherein for a destructive read operation of a data 1, the charge in the memory cell representative of the data 1 is shared with the local bitline, and is written back into the cell at the completion of the read operation by a self-timed write back of data to a memory cell after the data is destructively read from the memory cell in the read operation, wherein the second transistor is turned on to automatically write a data 1 back into the memory cell without an external timing signal.

18. The circuit of claim 1, wherein a read operation of a data 0 does not utilize any significant electrical power as no transistors are turned on.

19. The circuit of claim 1, wherein first and second local bitlines are coupled to the global bitline, and only one bitline is sensed at a time in a time multiplex mode, and the unsensed bitline is held at ground precharge, such that operations of the two bitlines do not interfere with each other.

20. The circuit of claim 1, in a folded bitline architecture having first and second local bitlines, each of which is connected to every other memory cell of a memory array, and a wordline is connected to every other local bitline, and the circuit provides improved noise immunity as each non-active bitline shields adjacent bitlines from the active bitline.

* * * * *